United States Patent [19]

Saulnier et al.

[11] Patent Number: 4,878,029

[45] Date of Patent: Oct. 31, 1989

[54] COMPLEX DIGITAL SAMPLING CONVERTER FOR DEMODULATOR

[75] Inventors: Gary J. Saulnier, Rexford, N.Y.; Randy G. Herrera, Pasadena, Calif.; Timothy E. Thiel, Troy, N.Y.

[73] Assignee: General Electric Company, Schenectady, N.Y.

[21] Appl. No.: 280,073

[22] Filed: Dec. 5, 1988

[51] Int. Cl.[4] .............................................. H03D 3/00
[52] U.S. Cl. .................................. 329/341; 375/102; 455/311
[58] Field of Search .............. 329/110, 124, 136, 139, 329/145, 207; 375/78, 80, 102; 455/214, 296, 303, 304, 305, 310, 311, 337

[56] References Cited

U.S. PATENT DOCUMENTS

4,647,864  3/1987  Rafferty et al. ............... 329/110 X
4,755,761  7/1988  Ray, Jr. ........................... 329/124 X
4,814,715  3/1989  Kasperkovitz .................. 329/124 X

Primary Examiner—Eugene R. LaRoche
Assistant Examiner—Robert J. Pascal
Attorney, Agent, or Firm—Geoffrey H. Krauss; James C. Davis, Jr.; Marvin Snyder

[57] ABSTRACT

A complex digital sampling converter, for use with an IF demodulator, includes: an analog-to-digital converter (ADC) receiving the IF analog signal for conversion to a digital data stream by sampling at a sampling rate frequency substantially equal to four times the IF signal frequency; a digital mixer for converting the sampled data to baseband; a sorter for separating the interleaved sequential in-phase I data words and quadrature-phase Q data words into a pair of concurrent I and Q data word streams; and at least one of a circuit for removing the effects of any DC offset in the analog IF signal applied to the ADC, and a circuit for correcting misalignment errors in the concurrent I and Q streams. Preferably, both correction circuits are utilized, with the DC offset removal circuit using averaging of all of the baseband samples, and the misalignment correction circuit averaging each pair of quadrature-phased Q data words while compensating the in-phase I data streams for the extra delay in the averaged Q data.

19 Claims, 5 Drawing Sheets

| FIG. 3a | FIG. 3b | FIG. 3c |

ASSEMBLE FIG. 3 AS SHOWN

FIG. 3b

COMPLEX DIGITAL SAMPLING CONVERTER FOR DEMODULATOR

The present invention relates to apparatus for recovering the modulating signal from a modulated RF carrier signal and, more particularly, to a complex digital sampling converter for converting an intermediate-frequency (IF) signal to baseband for subsequent demodulation, and substantially reducing effects of input signal DC bias and/or sampling time misalignment.

It is well known to utilize a superheterodyne form of receiver, in which the received carrier signal is frequency converted to an intermediate frequency (IF) at which filtering and modulation detection are accomplished. It is highly desirable to provide the IF receiver portion in monolithic integrated circuit form.

PRIOR ART

Figure 1:
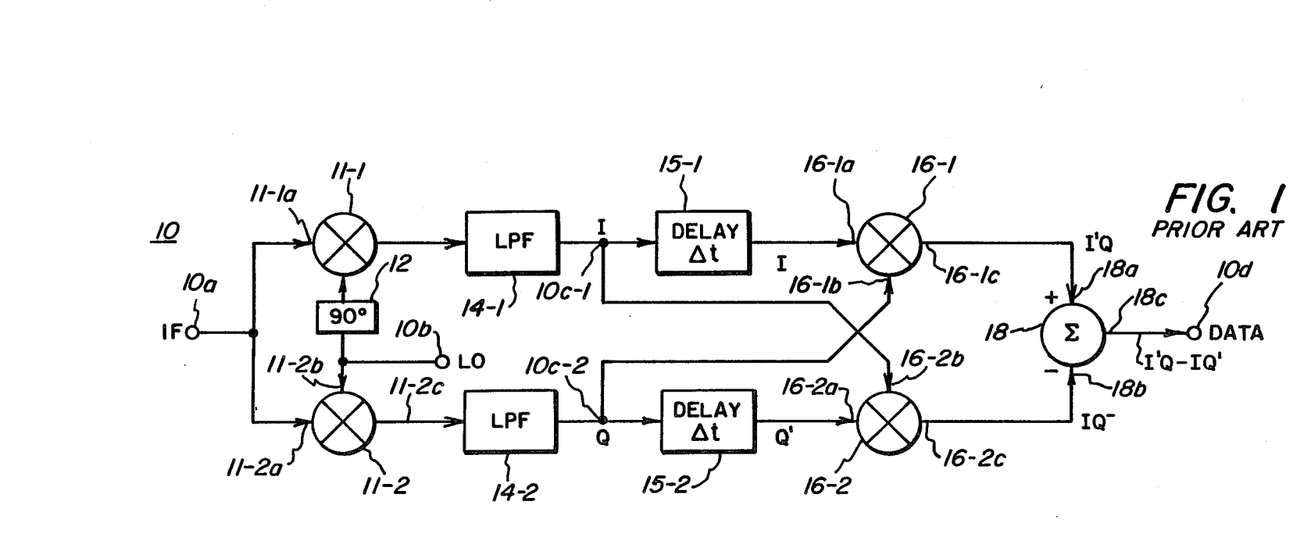
FIG. 1 is a schematic block diagram of a prior art zero-IF baseband demodulator.

One integratable demodulator is the baseband, or zero IF, FM demodulator described and claimed in U.S. Pat. No. 4,755,761, issued July 5, 1988, assigned to the assignee of the present invention and incorporated herein in its entirety by reference. A zero-IF baseband demodulator 10, as shown in FIG. 1, receives the down-converted IF signal at an input 10a for application to first inputs 11-1a and 11-2a of first and second RF mixer means 11-1 and 11-2. A locally-generated LO signal at the carrier frequency is provided at another input 10b; the local oscillator LO signal is applied directly to a second input, e.g. input 11-2b of one of the mixer means 11, and is phase-shifted by 90°, in a quadrature shift means 12, to provide a quadrature LO signal at a second input, e.g. input 11-1b, of the other mixer means. The baseband signals at mixer outputs 11-1c and 11-2c are respectively an in-phase signal and a quadrature-phase signal. After suitable lowpass filtering in one of lowpass filter LPF means 14-1 or 14-2, a baseband inphase I signal is provided at an intermediate node 10c-1 while a baseband quadrature-phase Q signal is provided at another intermediate node 10c-2. We denote the portion of demodulator 10 prior to nodes 10c as a converter, and denote the portion after nodes 10c as a discriminator. In the discriminator, each of the signals is delayed by a time interval $\Delta t$ in one of associated delay means 15-1 or 15-2, to provide respective delayed in-phase signal I' or quadrature-phase delayed signal Q'. A first multiplier 16-1 receives the delayed I' signal at a first input 16-1a and the undelayed Q signal at a second input 16-1b, to provide at an output 16-1c signal which is the QI' product, and is applied to a first input 18a of a summation means 18. A second multiplier means 16-2 receives the delayed Q' signal at its first input 16-2a and the undelayed I signal at its second input 16-2b for providing at its output 16-2c a product IQ' signal, for application to a subtractive second input 18b of the summation means. The difference signal at output 18b, provided at detector output 10d, is the modulation data which has been recovered from the frequency-modulated IF input signal. By alteration of the circuitry after nodes 10c, phase-shift keyed (PSK) and continuous-phase/frequency-shift-keyed (CPFSK) modulation can be recovered.

It will be seen that demodulator 10 utilizes a number of analog blocks; it is highly desirable to utilize digital signal processing to reduce the size, power and unit cost and increase the reliability of each of these blocks, as well as to facilitate fabrication of a completely digital demodulator as part of a single integrated circuit chip.

One promising digital demodulator is that of W. Rafferty et al., as described and claimed in U.S. Pat. No. 4,647,864, issued Mar. 3, 1987, assigned to the assignee of the present invention and incorporated herein in its entirety by reference. This non-coherent digital demodulator of analog FM signals utilized an analog-to-digital converter for converting the analog FM signal at the IF frequency to a sampled stream of digital data words, which are applied to a digital mixer for sorting into separate I and Q data streams which comprise the baseband representation of the modulated waveform. The use of a converter outputting two baseband data streams is necessary in order to retain both the phase and frequency information contained in the IF signal. A subsequent digital non-coherent detector is used to extract a sine function whose argument is proportional to the modulating signal. This function provides a demodulator digital data output, which can, if required, be converted back to an analog signal to provide a demodulator analog output. While substantially of digital nature, the entire converter-discriminator apparatus was found to produce a pair of undesired output side lobes whenever the sampling frequency was not exactly equal to four times the carrier frequency, and was also found to contain a second pair of undesired sidelobes, if the aforementioned frequency offset was present and there also was any DC content in the IF input signal. These two problems are associated with the converter portion of the apparatus. It is therefore highly desirable to provide a complex digital sampling converter in which DC bias and/or offset frequency errors do not substantially affect the modulation recovered by a subsequent digital discriminator portion of a FM demodulator.

BRIEF SUMMARY OF THE INVENTION

In accordance with the invention, a complex digital sampling converter for an IF demodulator includes: an analog-to-digital converter (ADC) means receiving the IF analog signal for conversion to a digital data stream by sampling at a sampling rate frequency substantially equal to four times the IF signal frequency; digital mixer means for converting the sampled data to baseband; means for sorting the interleaved sequential in-phase I data words and quadrature-phase Q data words into a pair of concurrent I and Q data word streams; and at least one of means for removing the effects of DC offset in the analog IF signal applied to the ADC and means for correcting misalignment errors in the concurrent I and Q streams.

In the present preferred embodiment, both correction means are utilized. The DC offset removal means uses averaging of the baseband samples, while the misalignment correction means averages each pair of quadrature-phased Q data words while compensating the in-phase I data streams for the extra delay in the averaged Q data.

Accordingly, it is an object of the present invention to provide a novel complex digital sampled converter, for use with a digital demodulator, which removes substantially all effects of analog signal input DC biasing and/or sampling frequency error upon the recovered data.

This and other objects of the present invention will become apparent upon reading the following detailed description of the invention, when considered in conjunction with the associated drawings.

DETAILED DESCRIPTION OF THE INVENTION

Figure 2:
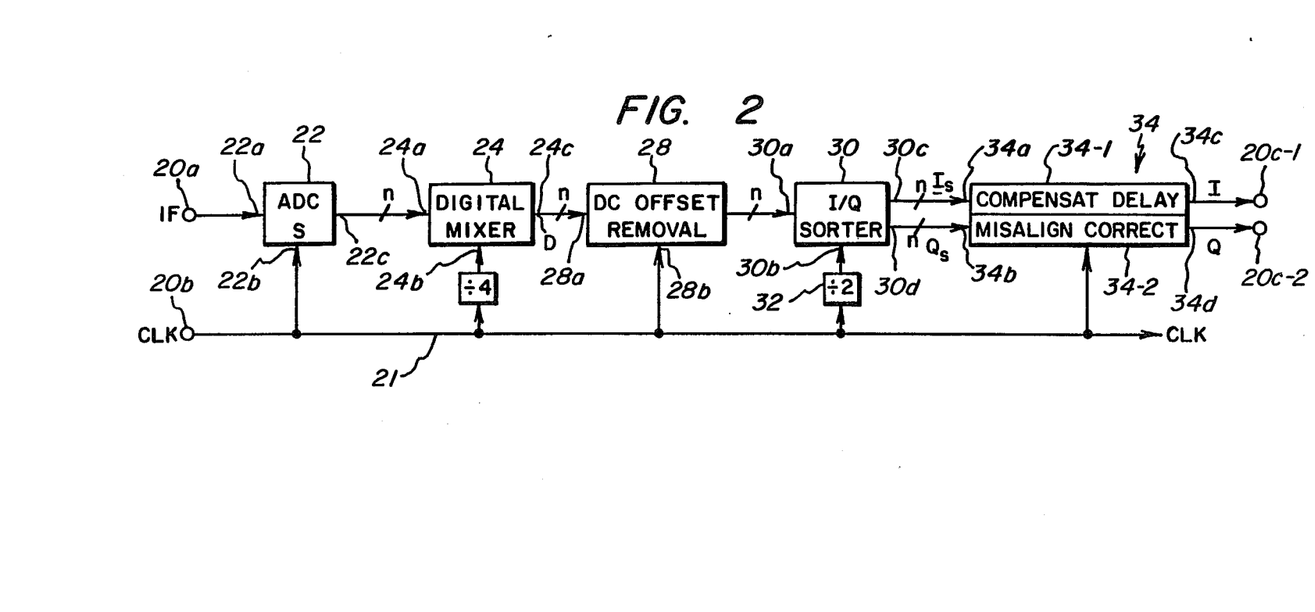
FIG. 2 is a schematic block diagram of a complex digital sampling converter, in accordance with the principles of the present invention, for producing baseband I and Q signals substantially free of DC input bias and/or sampling frequency error effects.

The presently preferred embodiment of our converter is illustrated in an FM demodulator. Referring initially to FIGS. 1 and 2, it will be seen that the demodulator digital frequency discriminator portion, which comprises digital delay means 15, digital multiplier means 16 and digital adder means 18, operates upon the in-phase I data signal and the quadrature-phase Q data signal, respectively, at nodes 10c-1 and 10c-2; the fully-digital discrimator implementation in the Rafferty et al. patent can be, and preferably is, utilized for this portion of the digital FM demodulator. The present invention is a complex digital sampling converter means 20 (FIG. 2) which provides a bias-free and/or offset-free stream of I and Q data words at a pair of output terminals 20c, equivalent to the nodes 10c at the input of the discriminator portion. Converter 20 receives the (frequency-modulated) analog IF signal at an input 20a; the IF signal has a center, or carrier, frequency $F_c$, illustratively 4 MHz. A sampling clock CLK signal is received at an input 20b, with a sample frequency $F_s$ ideally equal to four times the IF carrier frequency (i.e. $F_s=4F_c$), for producing the I and Q data streams at outputs 20c-1 and 20c-2, respectively, for introduction into the digital discriminator portion of the demodulator. The bandpass analog IF input signal is applied to the analog input 22a of a single ADC means 22, which receives the clock signals at a sampling-strobe input 22b, to provide four substantially-equally-spaced samples, each a digital data word of n parallel data bits at a data output port 22c, during each cycle of the input analog signal. Frequency translation of the sampled data to baseband is then performed by a set of latches in a digital mixer means 24. The stream of digital data words from ADC means 22 is provided to a first mixer means input 24a. The mixer has a local oscillator input 24b at which is received a square wave signal at substantially the IF frequency $F_c$; this square wave signal is provided by dividing the clock CLK signal (on clock bus 21) by a factor of 4, in a divide-by-four means 26.

In accordance with one aspect of the present invention, the baseband data signal, at digital mixer output 24c, is applied to a data input 28a of a DC offset removal means 28, which also receives the clock signal, from bus 21, at a second input 28b. The output 28c of the DC offset removal means is a stream of digital data words from which the effects of any DC bias on the analog input signal has been removed. This data stream is provided to the input 30a of a I/Q sorter means 30, having second input 30b receiving a substantially square-wave signal at one-half the clock CLK frequency, as provided by a divide-by-two means 32. Sorter means 30 sorts the time-sequential, interleaved I and Q data words so that a pair of sorted in-phase $I_s$ and sorted quadrature-phase $Q_s$ data words simultaneously appear at sorter outputs 30c and 30d. The sampled data words arrive at input 30a in a single stream at the sample rate ($F_s=16$ MHz, here) and leave in a pair of streams each at half the input sample rate (e.g. the $I_s$ and $Q_s$ words stream out at $F_s/2=8$ MHz.).

In accordance with another aspect of the present invention, a quadrature compensation means 34 receives the sorted $I_s$ and $Q_s$ data words and substantially removes the pair of modulated output side lobes which will normally occur if the sampling, or clock CLK, frequency $F_s$ is not exactly equal to four times the carrier frequency $F_c$ of the IF signal input to the demodulator. Quadrature correction means 34 includes a compensate delay means 34-1, receiving the $I_s$ signal at a first input 34a for producing a delay-corrected in-phase I signal at a first output 34c, coupled to the complex digital sampler output node 20c-1, and also includes a misalignment correction means 34-2, receiving the $Q_s$ signal at a second input 34b and providing the quadrature-corrected, quadrature-phase Q data stream at an output 34d, for coupling to the complex digital sampler second output node 20c-2.

It will be seen that only a single ADC means 22 is utilized. Unlike the mostly-analog converter in the prior art demodulator shown in FIG. 1, in this converter analog mixers and a quadrature phase splitter are no longer needed. As the digital mixing process does not produce higher frequency terms, there is no longer any need for lowpass filters. Most importantly, there is no requirement for two totally separate channels, each containing a mixer, a filter and a ADC means so that the need for obtaining closely-matched phase and amplitude response is removed.

Figure 2A:
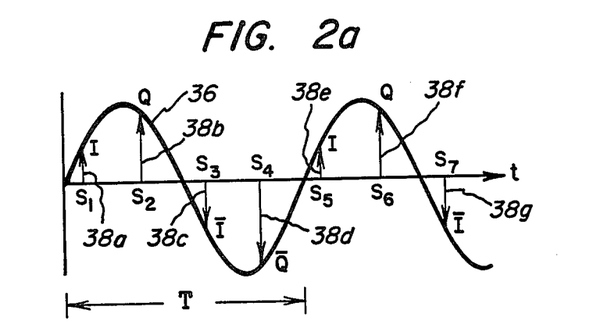
FIG. 2a is a graph illustrating an input analog signal wave and the nature of the complex digital sampling process, and useful in appreciating the problems alleviated by the present invention.

FIG. 2a illustrates the complex digital sampling process, wherein an analog signal waveform 36, occupying a time interval $T=1/F_c$, is sampled four times during each cycle thereof. The first sample $S_1$ produces a sampled signal 38a of a first amplitude, which is converted to a data word to be assigned to the in-phase I data stream. The next sample $S_2$ occurs at a time T/4 after sample $S_{S1}$, and produces a data sample 38b assigned to the quadrature-phase Q data stream. Thereafter, after another time interval T/4, a third sample $S_3$ is taken; this is another I sample. Because the sample data 38c of sample $S_3$ is now at a time interval T/2 after the initial I sample $S_1$, it occurs during the opposite-polarity half-cycle from the $S_1$ sample and must involve an inversion of the I data; i.e. is an inverted I, or I, sample. Similarly, the fourth sample $S_4$ is a next Q sample, provided at a time interval T/2 after the initial Q sample, so that the fourth sample data 38d is an inverted Q, or Q, sample. Thereafter, the 4-sample-per-cycle process repeats, with a I data stream sample $S_5$, a Q data stream sample $S_6$, and so forth. It will be seen that the third and fourth samples in each cycle are properly assigned to the respective I and Q data steams, but require multiplication by a factor of $-1$, which is effectively implemented as a simple inversion of the two's-complement representation of the sample data. Therefore, the complex digital sampling process can be accomplished in three separate steps: (a) sampling of the input waveform at a sampling frequency $F_s$ which is four times its center, or carrier, frequency $F_c$; (b) inversion of alternate pairs of the sampled signals; and (c) proper splitting of the stream of data samples into in-phase I and quadrature-phase Q components. These three process steps are carried out respectively in ADC means 22, digital mixer means 24 and I/Q sorter means 30.

Figure 2B:
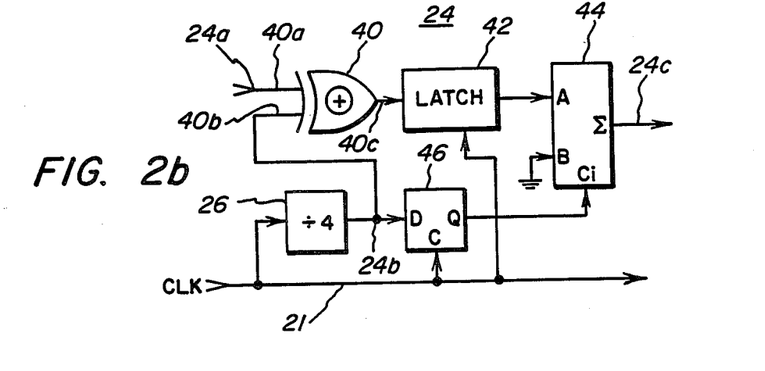
FIG. 2b is a schematic block diagram of a digital mixer utilized in the present invention.

Referring now to FIG. 2b, the digital mixer means 24 must convert the sample data stream down to baseband. This conversion is accomplished by a two's-complement inversion of every other pair of data words in the sample stream. The two's-complement inversion uses (a) inversion of each data bit of the input data (a one's-complement inversion), and (b) the addition of a value 1 to the result of (a). Here we use exclusive-OR gating, ideally with a center-frequency $F_c$ signal, which inherently inverts every other pair of sample data words, for the one's-complement inversion part (a). Having to produce an approximation of the center frequency, the local signal is provided by dividing the sampling clock CLK signal by a factor of 4 (in means 26). The single data stream is therefore introduced at mixer means input 24a, and each of the n parallel data bits is provided to a first input 40a of an associated exclusive-OR gate 40, which also receives the center frequency square-wave signal at its remaining input 40b. The exclusive-OR gates do not affect the input data when the input 40b is at a low logic level, but perform a one's-complement inversion when the input 40b is at a high logic level. In order to correctly complete the inversion of the two's-complement data appearing at input 24a (from ADC means 22), the quantity one must be added to the n=8 bit result of the one's-complement inversion. The one's-complement-inversion data at gate output 40c is temporarily latched, in latch means 42, responsive to a selected edge of the sampling clock CLK signal on bus 21; the latched data is provided to a first A data input of the associated one of n stages of an adder means 44. Each adder means 44 stage receive a low logic level at a second B data input. The least-significant-bit stage receives at its carry-in $C_i$ input a gating signal from means input 24b, via a type-D flip-flop latch means 46, which is responsive to the sampling clock CLK signal on bus 21. It will be seen that, because when the XOR gate input 40b is at a logic low level, the gates simply pass the data at input 40a in unchanged manner, the presence of a low logic level at the same time at the adder means 44 carry-in $C_i$ input will leave the data unchanged, so that a proper two's-complement inversion of alternate pairs of data samples is carried out, as required for the digital mixing step (b).

Figure 2C:
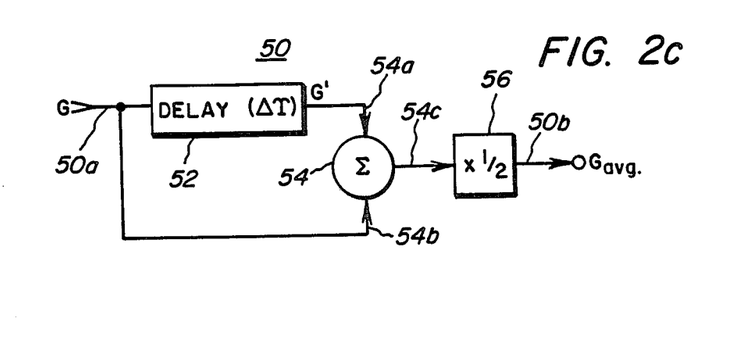
FIG. 2c is a schematic block diagram of one type of digital signal averager for use in the present invention.

Proper DC offset removal, in means 28, and quadrature misalignment correction, in means 34, as will be discussed hereinbelow, require that the average of two successive data samples be provided. Referring now to FIG. 2c, an averager means 50 receives a stream of data words G at an input port 50a and delays each sequential data word in a delay means 52, for a time interval $\Delta T$. Each word of a delayed data word G' stream is applied to a first additive input 54a of a digital adder means 54. The undelayed data stream G words appear at a second input 54b of the adder means. The adder means sum output 54c provides a data word which is then equal to $G(t)+G'(t)$; if $G'(t)=G(t+T/2)$, then the sum is $G(t)+G(t+T/2)$. The output of the adder means is operated upon by a multiply-by-one-half means 56, so that the output data at terminal 50b is $(G(t)+G(t+T/2))/2=G_{avg}$, or the average of the pair of sequential data samples. Multiplication by a factor of one-half, in means 56, is more easily accomplished as a digital division-by-2, which merely requires a one-bit digital rightward shift of all bits in the sum-data word.

Sorter means 30 separates the sampled data word stream into I and Q channels by offsetting one of the channels by a delay of T/4. Thus, a Q sample obtained at a time $(t'+T/4)$ is treated as though it were obtained at the same time as an associated I sample obtained at time $(t')$, although it is clear that data sample $I(t')$ is not actually obtained at the same time as data sample $Q(t'+T/4)$. Similarly, the next Q sample, i.e. the $Q(t'+3T/4)$ sample, is paired with, and treated as though simultaneous with, the next I data sample, which is the $I(t'+T/2)$ data sample intermediate to the pair of Q samples. This quadrature misalignment produces a pair of demodulator output side lobes if the sampling frequency $F_s$ is not exactly equal to four times the carrier frequency $F_c$. To illustrate, we define a frequency offset $\Delta F = F_c - (F_s/4)$. If the modulating signal is a tone at a modulating frequency $F_m$ and if the carrier is offset in frequency by $\Delta F$, then the resulting pair of demodulated signal sidelobes appear at $(F_m \pm 2\Delta F)$. We prefer, although do not require, that the highest modulating tone frequency is less than about 1 percent of the rate at which the I and Q samples are being generated (which rate is $2F_c$), so that the over-sampling characteristics can be used to solve the quadrature correction problem by averaging each Q data sample with the preceding Q data sample. The Q average data is then that of a "$Q_{avg}$" sample paired with the I sample which was taken at a time interval T/4 earlier. That is, over-sampling allows the data value $Q(t'+T/2)$ to be approximated as equal to $\frac{1}{2}(Q(t'+T/4)+Q(t'+3T/4))$; this $Q(t'+T/2)$ average value is then paired with the data sample $I(t'+T/2)$, to effectively eliminate the time offset introduced by the complex digital sampling technique. However, because the $Q_{avg}$ data word is not available until after a time $(t'+3T/4)$, the $I(t'+T/2)$ data word must be delayed (even though not averaged) to appear in time synchronization with the $Q_{avg}$ data word.

We have also found that, when a frequency offset $\Delta F$ is present, the demodulator output also contains a second pair of sidelobes, at frequencies $(F_m \pm \Delta F)$, which is caused by any DC content of the input signal. This DC bias is reduced, and can be substantially eliminated, by averaging successive samples separately in each of the I and Q channels. This can be understood by realizing that, before the inversion of alternate samples in each channel as part of the digital mixing process, a first I data word $I(t)$ is the result of digitization of an analog value $i(t)+dc$ where dc is any analog DC bias present. After one-half cycle, the next I data sample is, before inversion, $-I(t+T/2)$, which is the digitization of an analog input of $-i(t+T/2)+dc$. Inversion of the second sample means that to data word $I(t+T/2)$ is the digitization of the analog value $i(t+T/2)-dc$; only the polarity of the DC bias term changes. By summing both quantities, the DC bias data is effectively removed and cancelled.

In actual implementation of the hardware for averaging a pair of n-bit two's-complement numbers, for quadrature correction and/or DC removal, we have found that averaging by taking the sum of two samples and truncating the least-significant-bit (LSB) of the resulting (n+1)-bit data word (where truncation is intended to be equivalent to a division-by-2), introduces a one-half LSB bias in the negative sums, so that the transfer characteristic of the averager is not symmetrical and results in even harmonics at the demodulator output. We have found that a proper symmetrical response for the averager is provided by adding the quantity 1 to each negative sum, prior to truncation.

Figures 3, 3A:
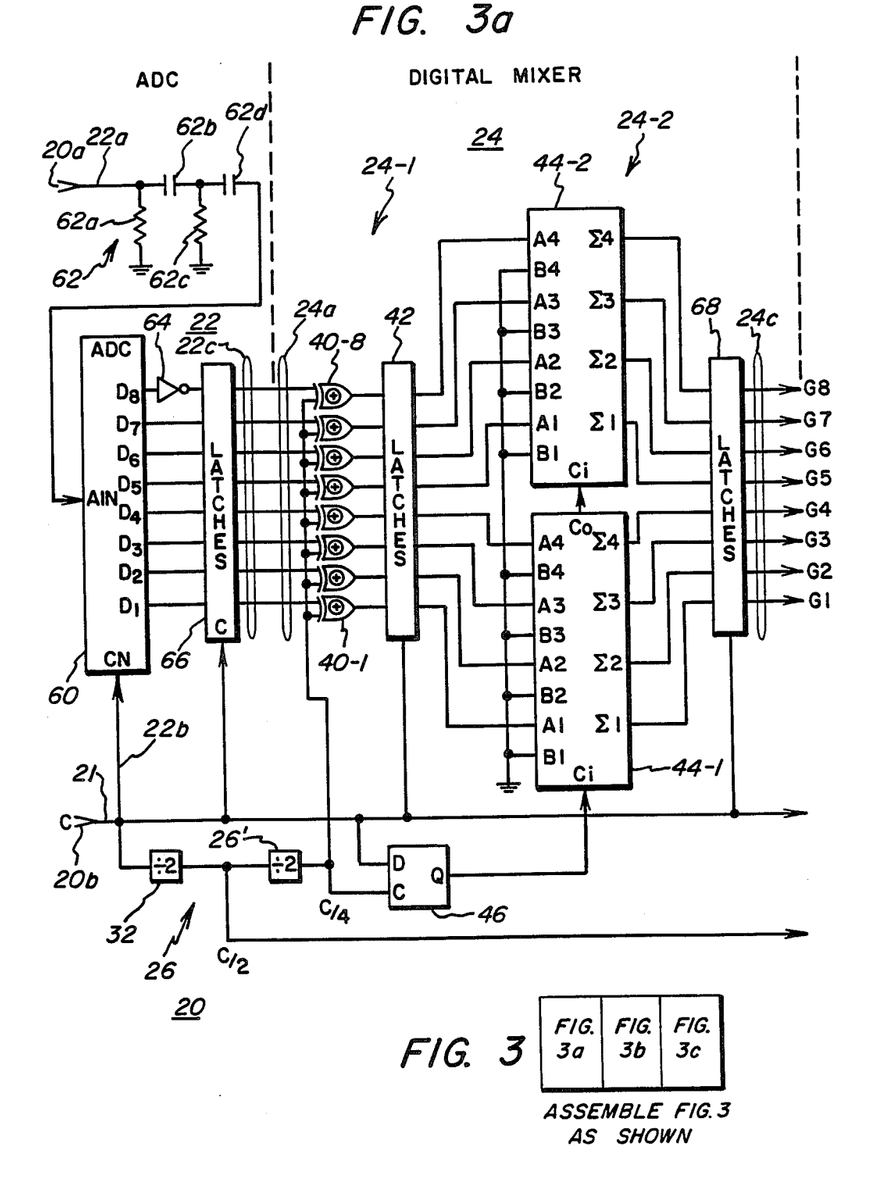
FIG. 3 is a schematic block diagram of one presently preferred embodiment of a complex digital sampling converter of the present invention, for use in a digital FM demodulator.
Figure 3B:
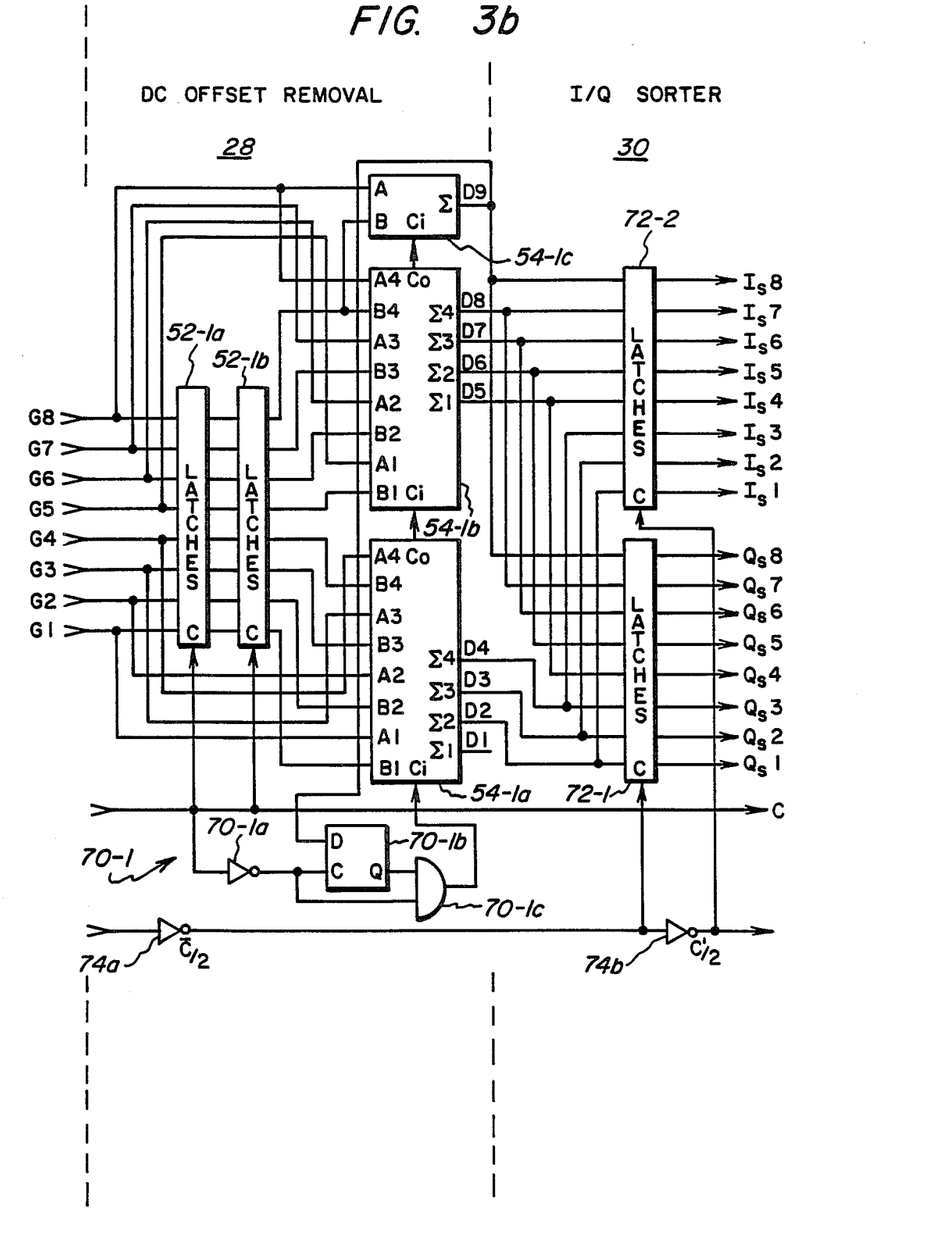
Figure 3C:
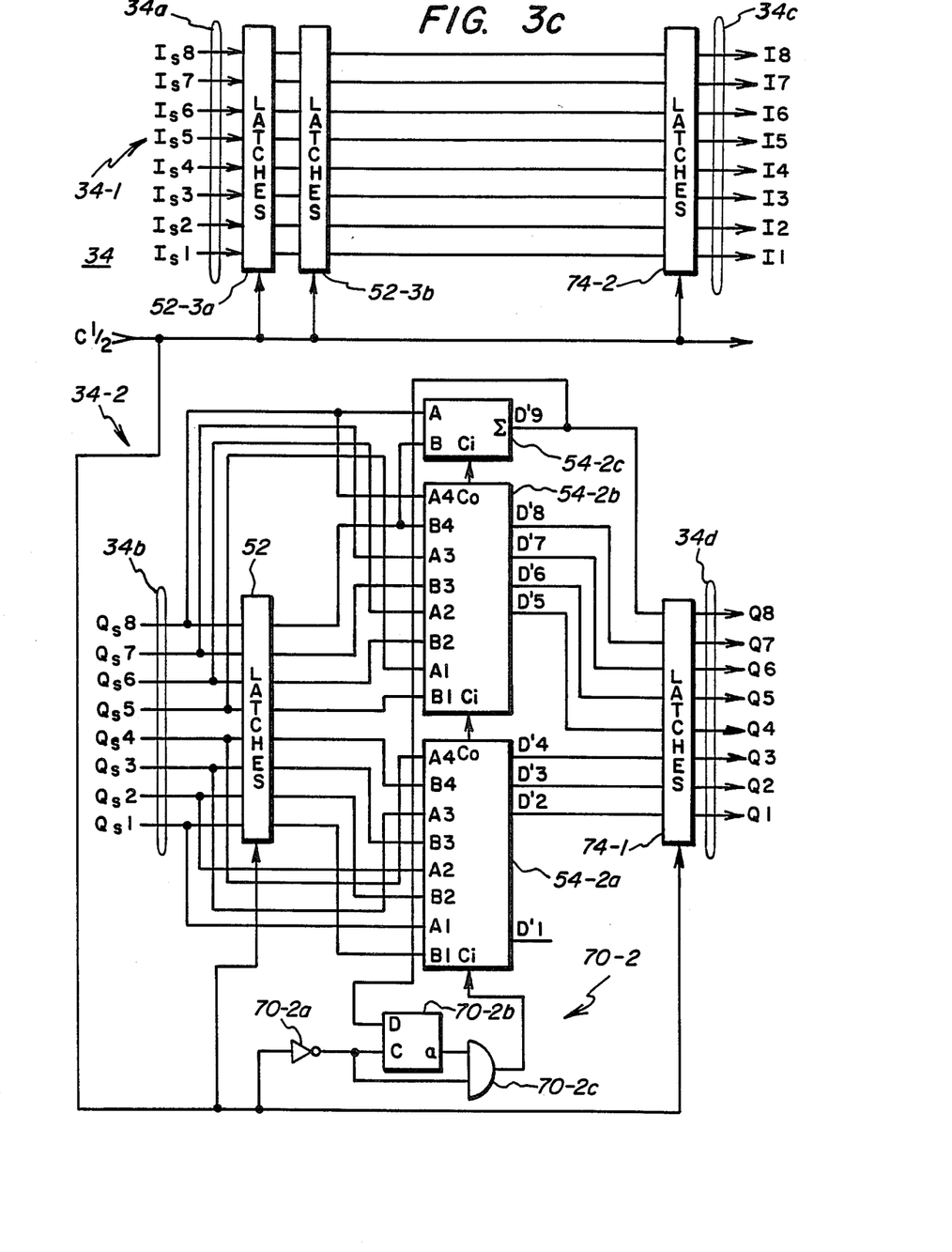

Referring now to FIG. 3, our presently preferred embodiment of complex digital sampling converter 20 utilizes an ADC means 60 with a maximum sampling rate of 20 MHz., for use with a 16 MHz. sampling clock C, as required, for an analog input AIN signal at a IF carrier frequency of about 4 MHz. If converter 20 is built in discrete-device form, means 60 is a type THC 1068 ADC available from TRW, while all the other blocks are industry-standard TTL/LSTTL digital circuitry of the 74/74LS series. This particular ADC has a built-in flash converter, analog amplifier, and precision reference generation circuitry, and provides a n=8 bit parallel data output. The DC content of the input signal is substantially reduced by utilizing a high pass filter means 62a, comprising a first section of resistor 62c and capacitor 62b, in a second section of resistor 62c and capacitor 62d, operating with the analog input impedance of the ADC. A logic inverter 64 is utilized in the ADC means most-significant-bit (MSB) data line D8, to change the offsetbinary data output format of means 60 to the desired two's-complement format. The two's-complement formatted sample (obtained for each sampling clock CLK pulse on bus 21) is temporarily captured and held in a first latch means 66, having a latch stage for each of the n=8 data lines. The latched converted data word is then provided to digital mixer means 24.

In the digital mixer, every other pair of samples is inverted responsive to a clock signal C/4 which is the system clock C reduced in frequency by a factor of four. The divide-by-4 means 26 actually consists of the divide-by-two means 32 and a subsequent divide-by-two means 26'. The digital mixer includes n=8 exclusive-OR gates 40-1 through 40-8, each having a first input receiving an associated one of the eight parallel data bits of the digital word then at mixer input 24a, and a second input, all connected in parallel to receive the C/4 clock bit from divider 26'. The output of each of XOR gates 40 is temporarily latched in an associated bit of latch means 42, responsive to an appropriate edge of the system clock C signal. To correctly invert the incoming two's-complement number, a pair of 4-bit adder means 44-1 and 44-2 are utilized, with one of the latched data bits, from latch means 42, appearing at each of the associated A inputs; a low logic level will appear at each of the associated B inputs. The LSB carry-in $C_i$ input of adder means 44-1 is the logic signal from the output of divider means 26', as latched in the type-D stage 46. The properly inverted n=8-bit two's-complement data sample, now at baseband, appears at the 8 summation $\Sigma$ outputs of adder means 44, and each bit is temporarily held in a mixer means output latch 68, to appear at the digital mixer output data port 24c.

The DC offset removal means 28 receives the sequential words, each of 8 parallel data bits G8-G1, from the digital mixer and takes the average of each sample data word then presently at the input with the second-previous data word; that is, if the present data word is a Q data word, the last-previous data word, being a I data word, cannot be included as part of the sample, so that the second-to-last data word (which is the next-previous Q data word) must then be utilized. Similar logic is required if the present data word is an I data word. Therefore, two inter-sample delays are required, each responsive to a different one of two consecutive clock C pulses. These delays are carried out in a first delay latch means 52-1a and a second delay latch means 52-1b. A nine-bit adder means 54 has a different one of the 8 undelayed data bits provided to each associated one of the A inputs of first and second 4-bit adder means 54-1a and 54-1b, while the MSB undelayed data bit is also provided to the A input of an additional ninth-bit adder stage 54-1c; this sign extension results in a nine-bit sample. A like-numbered bit of the twice-delayed data word is provided to each associated B input of the 8 stages of adder means 54-1a and 54-1b, with the MSB twice-delayed data bit also being provided to the B input of ninth stage 54-1c. Thus, the data values of consecutive samples (in either of the two data streams) is found at the appropriate output of latches 68 and latches 52-1b; these two consecutive sample values are added, and the sum is tested, so that a value of one can be added to the temporary sum if that sum is negative (to eliminate the previously described asymmetry). The resulting adjusted sum is then divided by two, by shifting the resulting 9-bit sum one digit rightwardly (so that the D1 LSB list is not used in the resulting output sum). It will be seen that this process requires that two separate sums be calculated: first, the two data values must be added together in order to determine the sign of the temporary sum and then, secondly, the adjusted sum must be formed with a bias correction. The sum adjustment feedback is provided by means 70-1, in which the system clock C signal is inverted by an inverter means 70-1a, to provide the clock signal to a type-D flip-flop 70-1d, and also to one input of a 2-input AND gate 70-1c. The summed output D9 bit of ninth $\Sigma$ stage 54-1c is coupled to the data D input of flip-flop 70-1b, and, when clocked, provides the Q output thereof to the other input of gate 70-1c. The AND gate output forces the carry input $C_i$ of adder stage 54-1a to a low level when the clock C signal is high, so that during the first half of each clock cycle the carry-in signal to the adders is low and the sign of the temporary sum is determined from bit D9. Responsive to the falling edge of the clock C signal, sign bit D9 is clocked into flip-flop 70-1b. The inverted clock signals at the other AND gate input now allows the sign bit to propagate from the flip-flop Q output through the gate and drive the carry input of the adders to the proper level. Thus, first half of a clock C cycle is utilized for adding together the present data term and the twice-previous data term, so that the sign of the sum can be determined. The second half of the clock cycle latches the sign bit in the flip-flop to drive the carry input of the adder stage; because the output of the present-data latches 68 and the output of the twice-delayed-data latches 52-1b have not changed, the corrected sum is formed. The 9-bits of corrected-sum data are shifted one bit rightwardly by hardwiring each bit $D_j$ (for $2 \leq j \leq 9$) as the output bit $D_{j-1}$ and ignoring the D1 bit.

In the I/Q sorter means 30, each bit is now applied in parallel to the like-bit input of both a Q latch means 72-1 and an I latch means 72-2. A first inverter 74a provides a half-frequency not-clock (C/2) waveform, which causes the Q samples to be latched in latch means 72-1 at each rising edge thereof. A second inverter 74b provides a C'/2 half-clock frequency pulse stream, with the rising-edges thereof being provided to the enabling input of latch means 72-2 with the proper timing to latch the I data words therein. Thus, the alternating rising edges on the C/2 and C'/2 signals cause the offset-compensated single data stream to be separated into its I and Q components, which are simultaneously made available, as n=8 bit-parallel data words. The Q quadrature-phase data word, of bits $Q_s8 - Q_s1$, appears at the output of latches 72-1, while the n=8-bit $I_s$ in-phase data word, of data bits $I_s8 - I_s1$, appears at the output of latches 72-2. Both data words are simultaneously input to the quadrature correction means 34.

Quadrature correction means 34 corrects the error introduced by the non-ideal quadrature sampling processing by doing an additional averaging of the quadrature-phase $Q_s$ data stream. The $Q_s$ data is delayed for one sample period (now equal to 2 clock time intervals) in a time delay latch means 52-2 receiving the half-clock-frequency clock pulses C'/2 at a clock latch C input. As in the averager in the DC removal means 28, during the first half the cycle of the actual clock (here, the C'/2 clock), a negative-sum detection circuit 70-2 acts upon the ninth data bit D'9 from a MSB adder means 54-2c to determine whether or not the sum is negative (with data bit D'9 being a high logic level, since two's-complement logic is used). The temporary sum sign determination governs the logic level of the carry-in $C_i$ bit to the first adder means 54-2a during the second half of the clock (C'/2) time period. When the present $Q_s$ word and one-sample-delayed $Q_s$ word are added to form the 9-digit number at the output of adder means 54, the LSB bit D'1 is discarded and a divide-by-to operation occurs. A resulting 8-bit quadrature-phase-corrected data word is latched in latch means 74-1 and is provided at correction circuit output 34d as the 8 bits Q8-Q1 of the quadrature-phase Q data word at converter output 20c-2. As the sorted in-phase $I_s$ data word was available at the same time as the sorted quadrature-phase $Q_s$ data word, the same interval of delay must be provided therefore in a delay means 52, utilizing delay latches 52-3a and 52-3b, and with a final output latch means 74-2, holding the delay-compensated sorted in-phase data I word of bits I8-I1 at output 34c, which is converter output 20c-1.

While one presently preferred embodiment of our complex digital sampling converter, for use with a digital discriminator in a FM digital demodulator, has been described in detail herein, many modifications and variations will now become apparent to those skilled in the art. It is our intent, therefore, to be limited only by the scope of the appending claims and not by the specific details and instrumentalities presented herein by way of explanation of one embodiment.

What we claim is:

1. A complex digital sampling converter, for providing substantially simultaneous output streams of in-phase I data and quadrature-phase Q data words to a digital detector means of a digital demodulator receiving an analog IF signal, comprising:
    ADC means for converting the analog IF signal, having a carrier frequency $F_c$, to a stream of digital data samples taken at a sampling frequency $F_s$ substantially equal to $4F_c$;
    digital mixer means for converting the digital data sample stream to a stream of baseband digital data words;
    sorter means for separating interleaved alternating ones of the baseband data word stream into sequential sorted pairs of an in-phase $I_s$ data word and a quadrature-phase $Q_s$ data word; and
    means for compensating the sorted pairs of data words for any quadrature misalignment effects, to provide the output data streams.

2. The converter of claim 1, wherein the compensating means comprises means for averaging the values of each pair of consecutive quadrature-phase $Q_s$ data words.

3. The converter of claim 2, wherein the averaging means comprises: means for summing the data values of each pair of consecutive $Q_s$ data words; and means for multiplying the summed data values by a factor of one-half.

4. The converter of claim 3, wherein the summing means comprises: means for causing each pair of consecutive data words to be simultaneously available; and adder means for summing the pair of simultaneously available data words.

5. The converter of claim 4, wherein the causing means includes means for delaying each of the quadrature-phase $Q_s$ data words by a time interval equal to the period between two successive $Q_s$ data words.

6. The converter of claim 3, wherein the multiplying means includes means for removing the least-significant-bit of the summed data value word and for shifting the remaining bits rightwardly by one bit position.

7. The converter of claim 2, wherein the compensating means further comprises means for delaying each of the in-phase $I_s$ data words by a time interval substantially equal to a time interval by which each of the quadrature-phase $Q_s$ data words is delayed in the averaging means.

8. The converter of claim 7, wherein the substantially equal delays of each of the data words is established by an integer number of cycles of a converter clock signal.

9. The converter of claim 8, wherein the converter clock signal is at the sampling frequency $F_s$.

10. The converter of claim 1, further comprising means for removing any undesired effects in the sorted data word pair due to a DC bias in the input analog signal.

11. The converter of claim 10, wherein the bias removing means includes means for separately averaging the values of each pair of consecutive in-phase data word and consecutive quadrature-phase data words.

12. The converter of claim 11, wherein the data words are arranged in a serially-interleaved stream, of the form I1—Q1—I2—Q2—...—$I_i$—$Q_i$—..., where i is an integer, and the averaging means includes: means for receiving the serial streams; means for delaying each data word $W_n$, where W is an alternate one of the I and Q phases and n is an integer, until the next data word W(n+1) of that phase is present at said receiving means; means for summing the delayed data word and next data word of that phase; and means for multiplying the summed data values by a factor of one-half.

13. The converter of claim 12, wherein the multiplying means includes means for removing the least-significant-bit of the summed data value word and for shifting the remaining bits rightwardly by one bit position.

14. The converter of claim 13, wherein the averaging means includes means for adding a data value of 1 to a temporary sum of the data if the temporary sum has a negative sign.

15. A complex digital sampling converter, for providing substantially simultaneous output streams of in-phase I data and quadrature-phase Q data words to a digital detector means of a digital demodulator receiving an analog IF signal, comprising:

ADC means for converting the analog IF signal, having a carrier frequency $F_c$, to a stream of digital data samples taken at a sampling frequency $F_s$ substantially equal to $4F_c$;

digital mixer means for converting the digital data sample stream to a stream of baseband digital data words;

sorter means for separating interleaved alternating ones of the baseband data word stream into sequential sorted pairs of an in-phase $I_s$ data word and a quadrature-phase $Q_s$ data word; and means for removing any undesired effects in the sorted data word pair due to a DC bias in the input analog signal.

16. The converter of claim 15, wherein the bias removing means includes means for separately averaging the values of each pair of consecutive in-phase data word and consecutive quadrature-phase data words.

17. The converter of claim 16, wherein the data words are arranged in a serially-interleaved stream, of the form $I1-Q1-I2-Q2-\ldots-I_i-Q_i-\ldots$, where i is an integer, and the averaging means includes: means for receiving the serial streams; means for delaying each data word $W_n$, where W is an alternate one of the I and Q phases and n is an integer, until the next data word $W(n+1)$ of that phase is present at said receiving means; means for summing the delayed data word and next data word of that phase; and means for multiplying the summed data values by a factor of one-half.

18. The converter of claim 17, wherein the multiplying means includes means for removing the least-significant-bit of the summed data value word and for shifting the remaining bits rightwardly by one bit position.

19. The converter of claim 18, wherein the averaging means includes means for adding a data value of 1 to a temporary sum of the data if the temporary sum has a negative sign.

* * * * *